(12) United States Patent
Carichner et al.

(10) Patent No.: US 7,769,103 B2
(45) Date of Patent: Aug. 3, 2010

(54) AMPLIFIER SYSTEM EMPLOYING ANALOG POLYNOMIAL PREDISTORTION WITH SUB-NYQUIST DIGITAL ADAPTATION

(75) Inventors: Scott Carichner, Rancho Santa Margarita, CA (US); Richard Neil Braithwaite, Orange, CA (US); Nikolai Maslennikov, Huntington Beach, CA (US); Matthew J. Hunton, Liberty Lake, WA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 968 days.

(21) Appl. No.: 11/520,216

(22) Filed: Sep. 13, 2006

(65) Prior Publication Data

US 2007/0063772 A1  Mar. 22, 2007

Related U.S. Application Data

(60) Provisional application No. 60/718,262, filed on Sep. 15, 2005.

(51) Int. Cl.
*H04L 25/49* (2006.01)

(52) U.S. Cl. .................. 375/296; 375/254; 375/278; 375/284; 375/285; 375/295; 332/107; 332/123; 332/159; 332/162; 455/501; 455/63.1; 455/67.13; 455/114.3

(58) Field of Classification Search ............. 375/254, 375/278, 284, 285, 295, 296, 297; 332/107, 332/123, 159, 162; 455/501, 63.1, 67.13, 455/114.3
See application file for complete search history.

(56) References Cited

U.S. PATENT DOCUMENTS

| 5,619,503 | A |  | 4/1997 | Dent |
| 5,892,397 | A |  | 4/1999 | Belcher et al. |
| 6,075,411 | A | * | 6/2000 | Briffa et al. ............... 330/149 |

(Continued)

OTHER PUBLICATIONS

IEE Proc. Commun., vol. 143, No. 2, Apr. 1996, p. 78-86, M. Ghaderi et al., "Fast Adaptive Polynomial I and Q Predistorter with Global Optimisation".

Analog Integrated Circuits and Signal Processing, vol. 22, No. 1, Jan. 2000, p. 31-39, Timo Rahkonen et al., "Using Analog Predistortion for Linearizing Class A-C Power Amplifiers".

(Continued)

*Primary Examiner*—Mohammad H Ghayour
*Assistant Examiner*—Leila Malek
(74) *Attorney, Agent, or Firm*—David L. Henty

(57) ABSTRACT

A predistortion linearized amplifier system that uses analog polynomial based predistortion is disclosed. An analog polynomial function generator receives polynomial parameter updates from a polynomial parameter generator. The polynomial parameter generator uses a combination of analog and digital signal processing to create the parameter updates. This processing is performed on input signal amplitude, detected using analog circuits, and RF coupled samples of the input signal, and the output signal. By using a combination of analog and digital signal processing means, digital processing can be performed at sub-Nyquist rates, significantly reducing the cost of digital circuits. Also, since the predistortion modulation signal is created with an analog function generator, time correlating delay is minimized reducing circuit costs.

14 Claims, 10 Drawing Sheets

U.S. PATENT DOCUMENTS

| | | |
|---|---|---|
| 6,236,837 B1 | 5/2001 | Midya |
| 6,275,685 B1 | 8/2001 | Wessel et al. |
| 6,567,478 B2 * | 5/2003 | Oishi et al. .................. 375/297 |
| 6,741,662 B1 | 5/2004 | Francos et al. |
| 7,551,686 B1 * | 6/2009 | Coons et al. ................. 375/296 |
| 2004/0247042 A1 | 12/2004 | Sahlman |
| 2005/0001684 A1 | 1/2005 | Braithwaite |
| 2005/0024138 A1 | 2/2005 | White et al. |
| 2005/0088230 A1 * | 4/2005 | Johnson et al. .............. 330/149 |
| 2005/0163268 A1 * | 7/2005 | McCallister ................. 375/346 |
| 2006/0217083 A1 * | 9/2006 | Braithwaite .............. 455/114.3 |

OTHER PUBLICATIONS

IEEE Trans. on Vehicular Technology, Vo. 41, No. 1, Feb. 1992, p. 49-56, P. Shawn et al., "An Adaptive Predistorter for a Power Amplifier Based on Adjacent Channel Emissions".

* cited by examiner

AMPLIFIER SYSTEM EMPLOYING ANALOG POLYNOMIAL PREDISTORTION WITH SUB-NYQUIST DIGITAL ADAPTATION

RELATED APPLICATION INFORMATION

This application claims the benefit of provisional application Ser. No. 60/718,262, filed on Sep. 15, 2005, the disclosure of which is incorporated herein by reference in its entirety.

FIELD OF THE INVENTION

The present invention relates to RF power amplifier systems. More particularly the present invention relates to predistortion linearized amplifier systems and related methods of linearizing such systems.

BACKGROUND, PRIOR ART AND RELATED INFORMATION

When preparing communication signals for transmission, amplifier circuits are used to increase transmitted signal output power. These amplifier circuits impart distortion on the signals amplified. Primarily, this distortion takes the form of changes in amplifier amplification as a function of input signal amplitude. These amplification changes affect both the in-phase and quadrature-phase components of the signal amplified. Such distortion impacts both signal modulation accuracy and spectrum emissions. Modulation accuracy must be maintained to ensure link clarity. Spectrum emissions must be maintained to meet regulatory body mandated compliance. Amplifier distortion therefore must be maintained within the limits of modulation accuracy and spectrum emissions.

Amplifier linearity can be achieved by various means, with each means bearing different performance, complexity, and cost challenges. Predistortion is one such approach. Several predistortion methods have been attempted to improve amplifier linearity with various levels of success. For example, simple, in line, RF circuit predistorters have been constructed which provide modest linearity improvement. Such circuits generally fail to sufficiently improve amplifier linearity with respect to modulation accuracy or spectrum emissions requirements particularly when used in conjunction with Class AB amplifiers.

A more sophisticated approach employs predistorters based on complex modulation of the input RF signal, as a function of input signal amplitude. Such predistorters require time delay in the RF signal path to provide time correlation with the RF amplitude detection, predistortion function application, and signal modulation. When such predistortion methods are used, the time delay of the amplitude detection, predistortion function application, and RF signal modulation path should be kept to a minimum, in order to keep RF time delay circuits manageable in size and cost. Of these three circuits in this path, predistortion function application circuits are the most challenging. First, the function generated must include complex components (in-phase and quadrature-phase). Second, the function must be a near inverse of the imparted amplifier distortion in order to linearize the amplifier to modulation accuracy and spectrum emissions requirement limits. Third, the function must adapt to track changes in the amplifier based on amplifier supply voltage, temperature, aging, etc.

Previous designs have met the above noted three predistortion function generation goals with various levels of success. Some use analog circuits to create the function while making little or no effort in tracking amplifier changes. These attempts generally provide slightly better performance than simple, in line, RF predistorters but with a significant increase in circuit design complexity. Others use digital means to create, adapt, and apply the predistortion function to the predistortion modulator. While successful, these digital methods greatly increase design complexity and cost. When creating the predistortion modulation signal using digital means, Nyquist sampling requirements must be met. Meeting Nyquist requirements means using high speed analog-to-digital and digital-to-analog conversion circuits. Signal processing must be performed at Nyquist based rates. Also, anti-aliasing and reconstruction filtering must be used prior to sampling the amplitude signal, and after creating the function based predistortion modulation signal respectively. Finally, all the circuit complexity caused by using the digital approach increases function generation delay. Delay circuits can become quite large and costly.

Accordingly a need presently exists for a more efficient approach to implementation of predistortion linearization of power amplifiers.

SUMMARY OF THE INVENTION

In a first aspect, the present invention provides a predistortion linearized amplifier. The amplifier comprises an input receiving an analog RF input signal, an analog predistortion module including an analog function generator providing analog predistortion signals based on predistortion parameters and an analog predistorter receiving the RF input signal and predistorting the RF input signal based on the analog predistortion signals, an amplifier receiving and amplifying the predistorted RF input signal and providing an RF output signal, and an adaptation module coupled to the input and the amplifier output for providing updated predistortion parameters to the analog function generator. The adaptation module includes sub-Nyquist sampling means for providing time correlated sub-Nyquist rate samples of the input and output RF signals and sub-Nyquist processing means for calculating updated predistortion parameters from the sub-Nyquist samples and providing the parameters to the analog function generator.

In a preferred embodiment the predistortion linearized amplifier further comprises an amplitude signal generator receiving the RF input signal and providing an amplitude signal related to the input signal magnitude to the analog predistortion module and the adaptation module. The analog predistorter is preferably a quadrature modulator. The adaptation module preferably further comprises an error detector receiving analog samples of the RF input signal and RF output signal and providing in phase and quadrature analog error signals to the sub-Nyquist sampling means. The adaptation module also preferably further comprises analog signal processing means for performing dynamic signal processing on the in phase and quadrature analog error signals and the amplitude signal and outputting M analog signals to the sub-Nyquist sampling means, where M is an integer. In particular, the dynamic signal processing performed by the analog signal processing means may comprise one or more of integration, differentiation and filtering. The sub-Nyquist sampling means preferably comprises a plurality of sample-and-hold circuits and a timing generator providing sampling timing control signals to the plurality of sample-and-hold circuits. The plurality of sample-and-hold circuits may comprise M circuits which receive and sample respective ones of said M signals from the analog signal processing means.

In another aspect the present invention provides a predistortion linearized amplifier system, comprising an input receiving an analog RF input signal, an analog predistorter receiving and predistorting the input signal, an analog polynomial function generator coupled to the analog predistorter and providing analog polynomial functions to control the predistortion, an amplifier coupled to the output of the analog predistorter and amplifying the predistorted input signal to provide an RF output, and a polynomial parameter generator coupled to receive analog samples of the RF input and RF output signals and provide updated polynomial parameters to the polynomial function generator. The polynomial parameter generator comprises an error detector operating on the analog input and output samples to provide error signals and a sub-Nyquist digital processor operating on discrete sub-Nyquist time correlated samples of the error signals to derive the updated polynomial parameters.

In a preferred embodiment the predistortion linearized amplifier system further comprises an input signal magnitude detector outputting an amplitude signal and the sub-Nyquist digital processor correlates discrete sampled error signals with discrete sampled amplitude signals, accumulates them and derives the polynomial predistortion parameters from the accumulated correlated discrete signals. Some of the accumulated error and amplitude data pairs may be selectively rejected and not used to derive polynomial predistortion parameters. For example, error and amplitude pairs with low amplitudes may be rejected. The polynomial predistortion parameters may be zero crossing coefficients. The analog predistorter is preferably an analog quadrature modulator.

In another aspect the present invention provides a method for adaptive analog predistortion of an amplifier system having an RF input receiving an RF input signal, an RF amplifier, and an RF output providing an RF output signal. The method comprises detecting an amplitude signal related to the magnitude of the RF input signal, providing analog predistortion functions based on the amplitude signal and polynomial predistortion parameters, and predistorting the RF input signal employing the analog predistortion functions. The method further comprises detecting analog samples of the RF input and RF output signals and adaptively updating the polynomial predistortion parameters employing analog processing of the amplitude signal and the analog input and output samples to provide plural analog processed signals, followed by digital processing of sub-Nyquist time correlated discrete samples of the plural analog processed signals.

In a preferred embodiment of the method for adaptive analog predistortion of an amplifier the digital processing correlates discrete sampled errors with discrete sampled amplitudes, accumulates them and derives updated polynomial predistortion parameters therefrom. The method may further comprise selectively rejecting some of the correlated error and amplitude data pairs. For example, error and amplitude pairs with low amplitudes may be rejected. The polynomial parameters may be zero crossing coefficients. The analog predistortion functions preferably comprise in phase and quadrature predistortion functions.

Further aspects of the present invention are set out in the following detailed description.

DETAILED DESCRIPTION OF THE INVENTION

Figure 1:
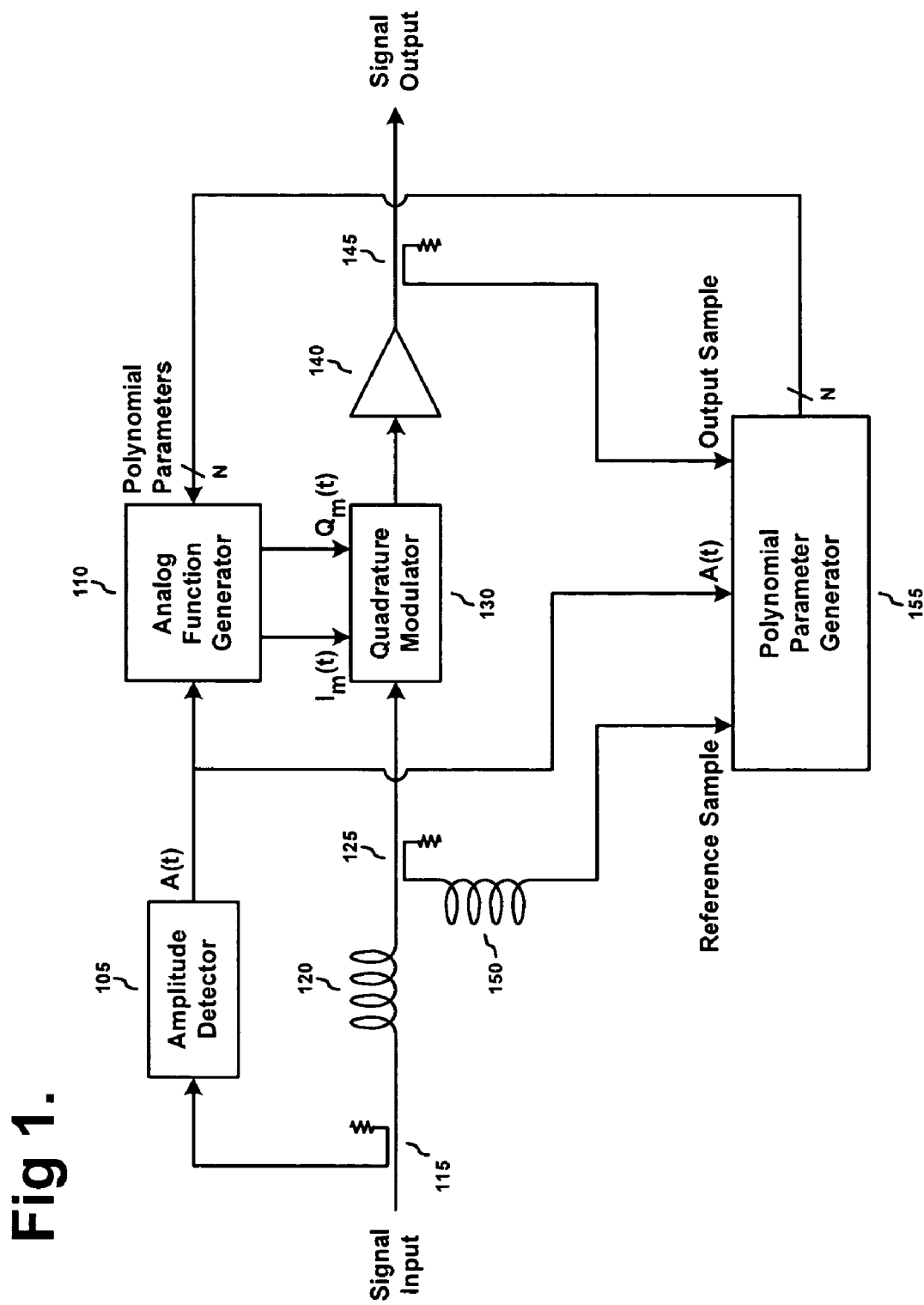
FIG. 1 shows a block diagram of an analog polynomial predistortion linearized amplifier where polynomial parameters are determined in a polynomial parameter generator, in accordance with a preferred embodiment of the present invention.

FIG. 1 shows a block diagram of the predistortion linearized amplifier of the present invention. The RF input signal is amplified by passing through a signal path including an input coupler (115), predistortion delay (120), reference coupler (125), quadrature modulator (130), amplifier (140), and output coupler (145). Predistortion is applied to the RF signal by a circuit path providing input coupling (115), amplitude detecting (105), creating amplitude based quadrature modulation signals, $I_m$ and $Q_m$, through analog function generation (110), and applying the generated modulation signals to the RF input signal with a quadrature modulator (130). All of the RF signal input path (115, 120, 125, and 130), and all of the quadrature modulation path (115, 105, 110, 130) blocks described are analog circuits. This implementation reduces the predistortion delay (120) time required to time correlate the RF signal path to the quadrature modulation path.

Reducing the predistortion delay (120) is desirable since it reduces product cost, size, and input circuit loss prior to amplification. This input circuit loss increases amplifier noise figure unless the predistortion delay (120) includes amplification elements (not shown). Finally circuits providing large amounts of delay tend to drift in delay and phase shift. This drift is minimal for short delay circuits.

The quadrature modulation signals, $I_m(t)$ and $Q_m(t)$, created by the analog function generator (110) determine predistorter effectiveness. These modulation signals are based on polynomials of the input signal amplitude provided to the analog function generator (110) by the amplitude detector (105). The amplitude detector need not be perfectly linear but should be monotonically increasing with increasing signal amplitude. The internal circuits of the analog function generator (110), along with input polynomial parameters, determine the polynomial functions, $I_m(t)$ and $Q_m(t)$. Predistortion occurs any time the input polynomial parameters, along with the internal circuits of the analog function generator (110) cause the input signal amplitude from the amplitude detector (105) to induce a near inverse to the distortion caused in the amplifier (140) through predistortion modulation (130). Predistortion effectiveness is determined by how close the induced predistortion modulation is to a near inverse to the amplifier (140) distortion. Once the polynomial parameters applied to the analog function generator (110) produce the desired predistortion effect, the polynomial parameters can be set for as long as the amplifier (140) distortion remains unchanged. As the amplifier (140) distortion characteristics slowly change, predistortion effectiveness will also slowly reduce given a fixed set of polynomial parameters applied to the analog function generator (110).

Figure 2:
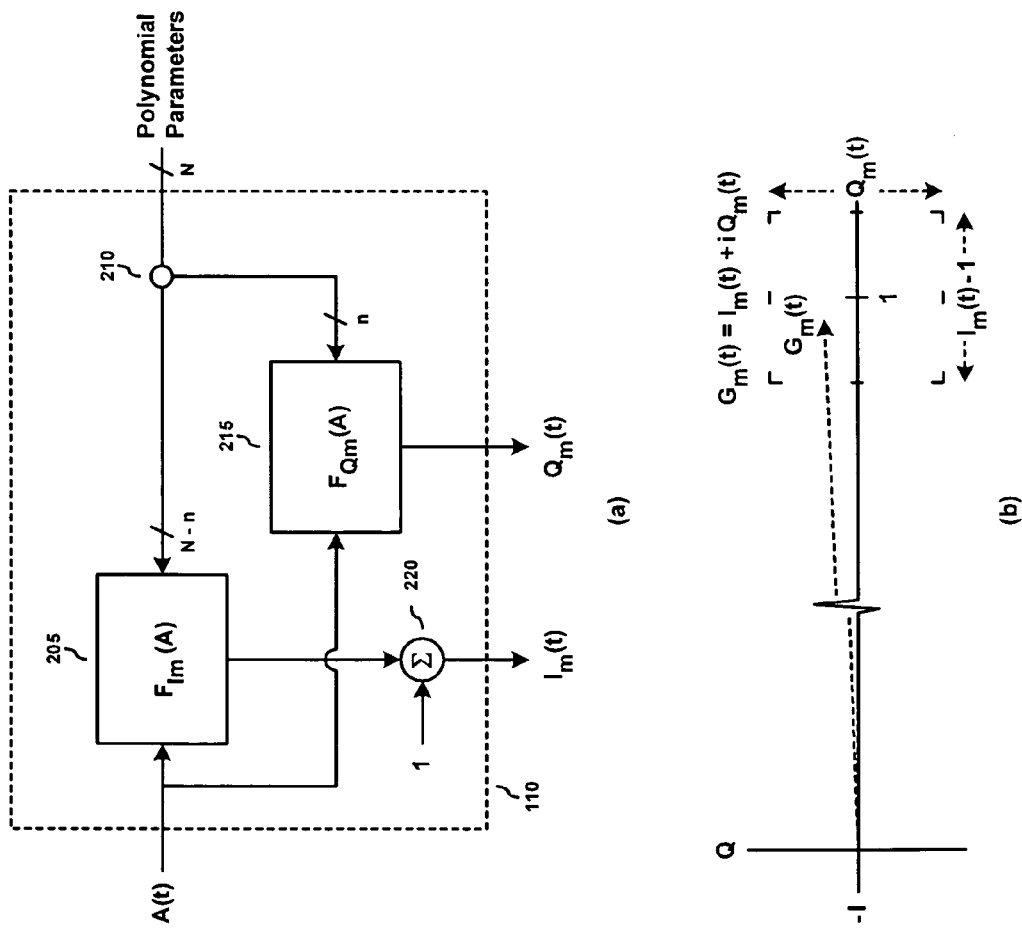
FIG. 2 shows a detailed block diagram of the analog function generator of FIG. 1 and a vector representation of the modulation signals generated by the analog function generator.

FIG. 2(a) shows a detailed block diagram of the analog function generator (110). The analog function generator creates quadrature modulation signals $I_m(t)$ and $Q_m(t)$ based on the input amplitude signal A(t) and polynomial parameters. The N input polynomial parameters are parsed (210) between the in-phase analog function generator $F_{Im}(t)$ (205) and the quadrature-phase analog function generator $F_{Qm}(t)$ (215) with a N-n to n ratio respectively. This parameter parsing (210) is based on the expected complexity of the functions generated. For example, $F_{Im}(t)$ (205) may require a third order polynomial while $F_{Qm}(t)$ (215) may only require a second order polynomial. The output of the in-phase component block (205) is combined (220) with a constant value, shown as one in FIG. 2(a). When the full predistortion system is first initiated, the predistortion parameters will create zero valued functions for both $F_{Im}(t)$ (205) and $F_{Qm}(t)$ (215) regardless of the value of A(t). By adding a constant value to the output of the $F_{Im}(t)$ block (205), the gain of the quadrature modulator (130) will operate about a fixed nominal value. The modulation signals provided by analog function generator (110) can be represented in vector form as shown in FIG. 2(b). The gain operates at a nominal value, shown as 1, in FIG. 2(b). The in-phase function generator block (205) and the quadrature phase function generator block (215) adjust the quadrature modulation about this nominal gain value. As the full predistortion system operates, the polynomial parameters are updated until dynamic gain modulation applied produces the desired predistortion effect. The polynomial parameter generator (155) of FIG. 1 provides these polynomial parameter adjustments.

Referring again to FIG. 1, the polynomial parameter generator (155) receives as inputs, the input signal amplitude from the amplitude detector (105), a reference signal sample from the reference coupler (125), and an output signal sample from the output coupler (145). The reference signal and output signal samples must be amplitude matched and time coincident at the input of the polynomial parameter generator. Amplitude match is achieved by proper setting of the reference coupler (125) and output coupler (145). Signal attenuators (not shown) may also be placed in one or both paths to aid in achieving this goal. To make the reference and output signals time coincident at the polynomial parameter generator input, a reference delay (150) follows the reference coupler (125). With the input amplitude signal, A(t), and the amplitude matched and time coincident reference and output signals applied, the polynomial parameter generator (155) can determine input amplitude based polynomial parameters that will produce effective predistortion performance from the circuits described in previous paragraphs.

Figure 3:
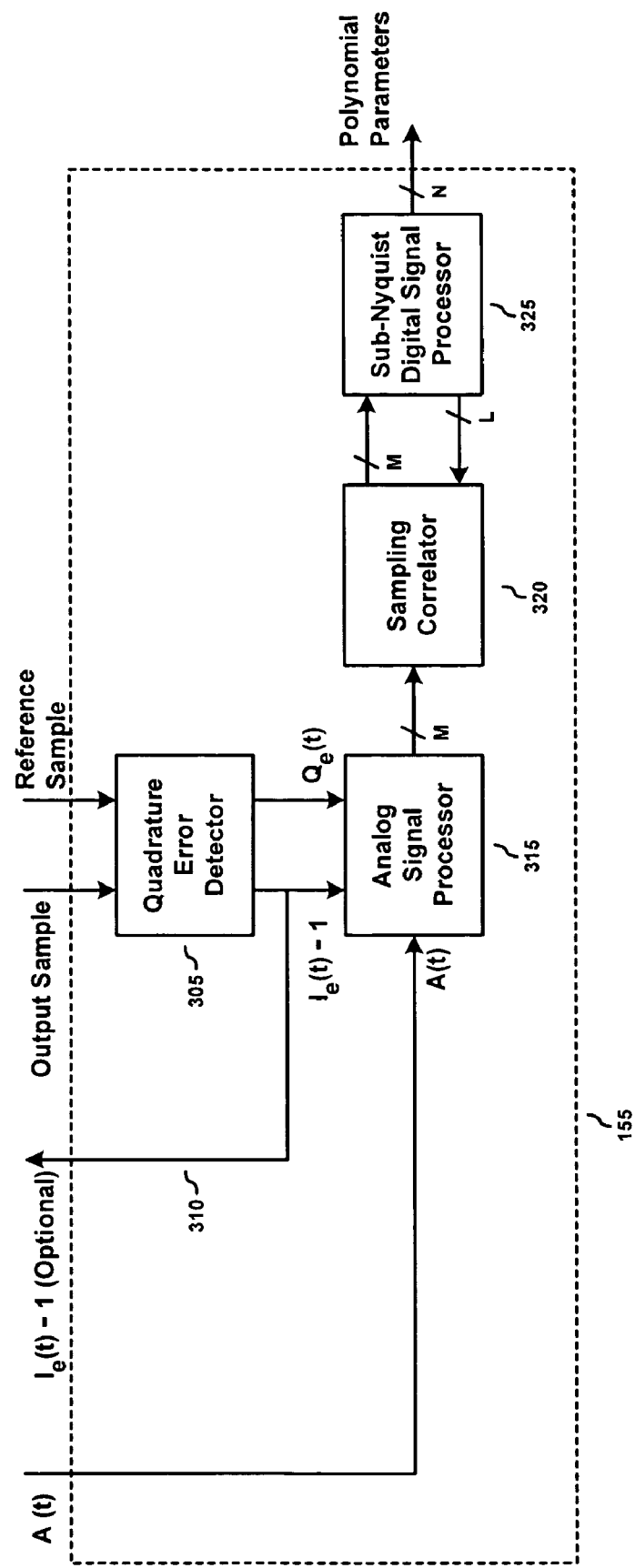
FIG. 3 shows a block diagram of the polynomial parameter generator of FIG. 1 employing a sub-Nyquist digital signal processor.

FIG. 3 shows a detailed block diagram of the polynomial parameter generator (155). The polynomial parameter generator shows as inputs, the input signal amplitude, A(t), the reference sample, and output sample. The input signal amplitude is taken from the amplitude detector (105). The reference sample and output sample were taken from the reference coupler (125), delayed through the reference delay (150), and the output coupler (145) respectively. The polynomial parameter generator (155) shows as outputs the polynomial parameters and optionally the in-phase component, $I_e(t)-1$, of the quadrature error detector (305). The need for this optional output will be described in a second embodiment of the invention.

Figure 4:
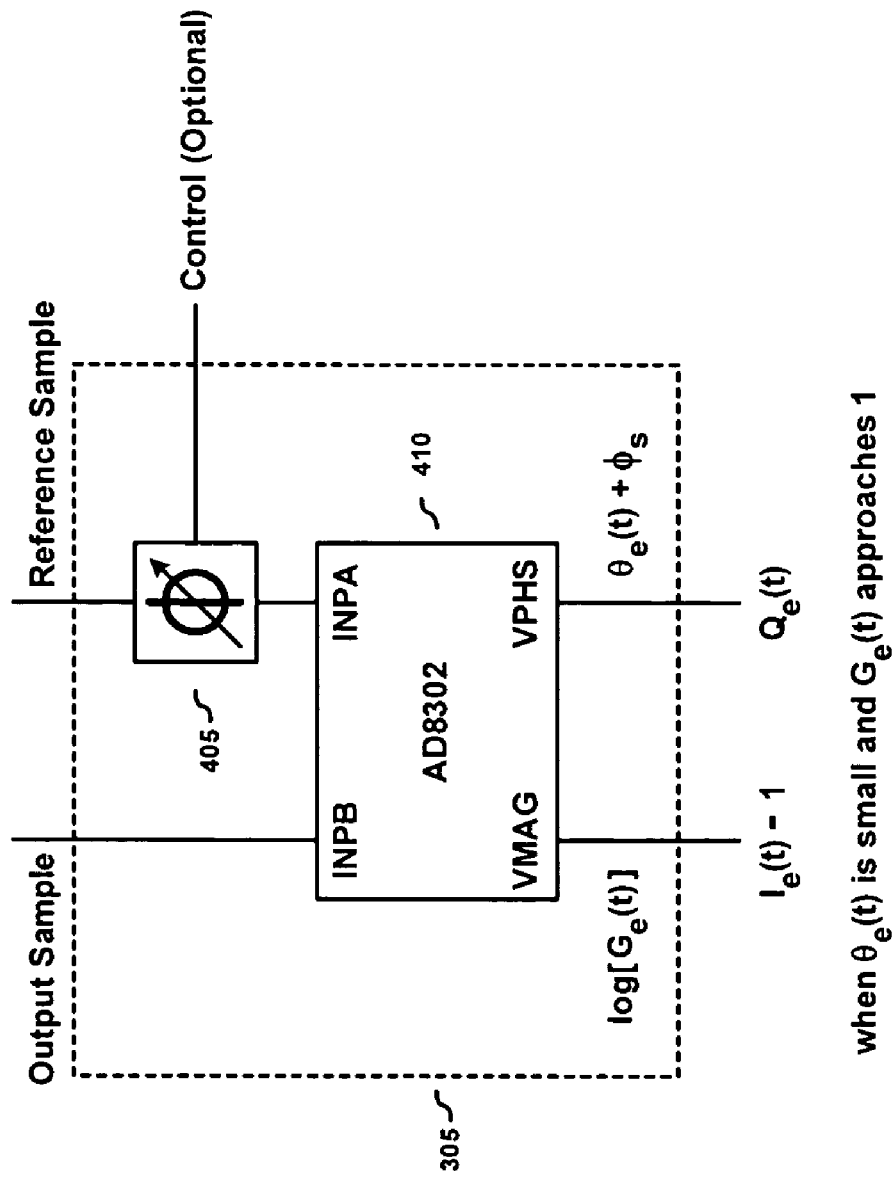
FIG. 4 shows a block diagram of the quadrature error detector used in the polynomial parameter generator of FIG. 3.
Figure 5:
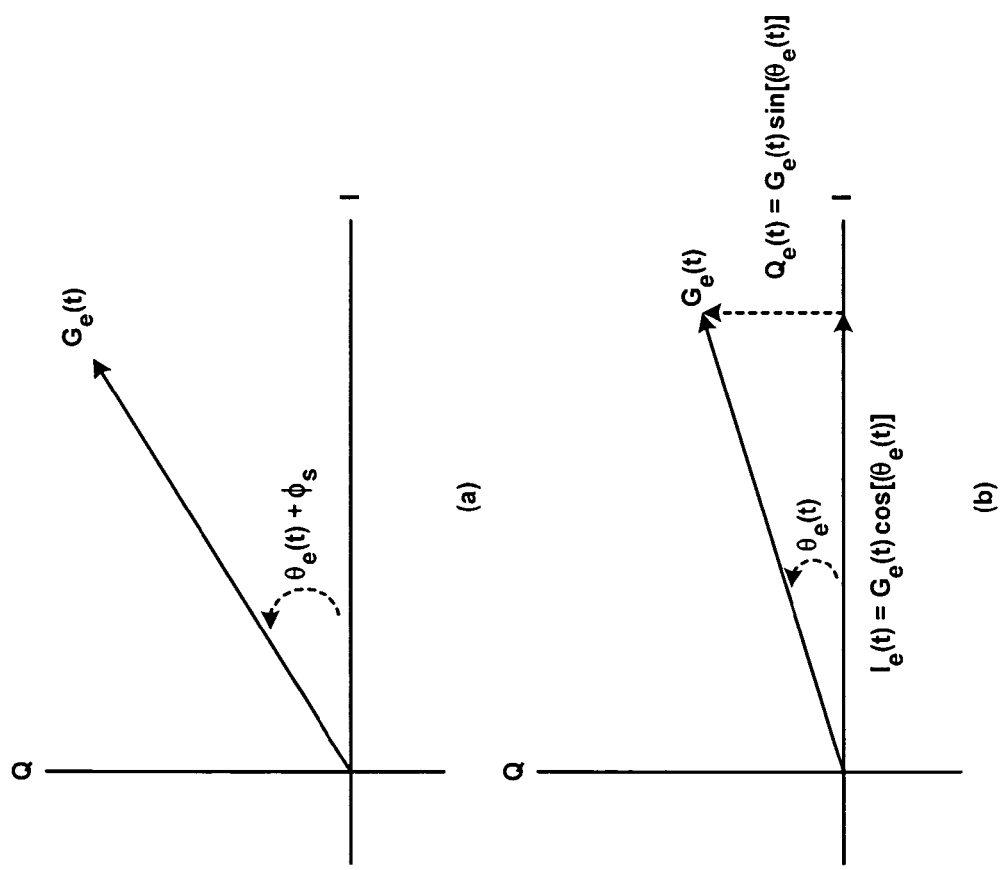
FIG. 5 shows a vector analysis of the analog processing performed by the quadrature detector of FIG. 4.

The reference sample and the output sample are applied to a quadrature error detector (305). This detector produces two quadrature error signals, $I_e(t)-1$ and $Q_e(t)$. These signals may be developed with use of conventional circuitry components, for example a commercially available circuit such as Analog Devices part no. AD8302, or similar component/circuit. FIG. 4 shows a basic circuit representation of the quadrature error detector using the AD8302. The AD8302 (410), by itself, generates two outputs, one representing the logarithm of the ratio of the two input signal amplitudes, and the other representing the phase difference between the two input signals. The reference sample is phase shifted (405) and applied to INPA of the AD8302 (410). The output sample is applied to INPB of the AD8302 (410). The output from the VMAG port, $\log[G_e(t)]$, represents the logarithm of the ratio of the output sample over the input sample. The two components of the VPHS port output, $\theta_e(t)+\phi_s$, represent the phase difference between the reference sample and the output sample. The dynamic portion of the phase difference, $\theta_e(t)$, is caused by distortion in the circuits between the reference coupler (125) and the output coupler (145). The static portion of the phase difference, $\phi_s$, represents fixed phase offsets in the reference coupler (125), reference delay (150), phase shifter (405), quadrature modulator (130), amplifier (140), and output coupler (145). This static delay is removed by the phase shifter (405) leaving only the dynamic phase error component $\theta_e(t)$. The signals $I_e(t)-1$ and $Q_e(t)$ are developed from $\log[G_e(t)]$ and $\theta_e(t)$ by considering FIG. 5. FIG. 5 (a) shows the gain ratio of output sample over reference sample in vector form. Given the reference sample, the output sample could be calculated by multiplying the reference sample by the signal ratio $G_e(t) \exp[i\,\theta_e(t)]$, where "exp" represents the complex exponential. The Cartesian components of this signal ratio are $G_e(t)\cos[\theta_e(t)]+iG_e(t)\sin[\theta_e(t)]$. Given the fact that the circuits between the reference coupler (125) and the output coupler (145) begin with some degree of linearity, and that this linearity improves as predistortion is applied, it can be assumed that the gain ratio $G_e(t)$ is near the value of one, and that the phase difference $\theta_e(t)$ is small. With these assumptions, the Cartesian representation of the signal ratio becomes $G_e(t)+i\theta_e(t)$. This simplification can be made because the cosine of a small angle is approximately one, the gain ratio $G_e(t)$ is approximately one, and the sine of a small angle equals the small angle. Substituting $I_e(t)$ for $G_e(t)$ and $Q_e(t)$ for $\theta_e(t)$ and recalling that the output of the VMAG port of the AD8302 is $\log[G_e(t)]$ the outputs of the AD8302 (410) become $\log[I_e(t)]$ and $Q_e(t)$. One final simplifying assumption can then be made. Since the $\log(x)$ approximately equals x−1 for values of x near 1, $\log[I_e(t)]$ can be simplified to $I_e(t)-1$. With the static phase shift, $\phi_s$, removed by phase shifter (405), the AD8302 becomes a quadrature error detector with outputs $I_e(t)-1$ and $Q_e(t)$ respectively. These two outputs are convenient because as the system is predistorted both measured error components will approach zero.

When using a quadrature error detector (305) as defined in the previous paragraph, consider the effect of slow phase drift in the circuits that present the reference sample and input sample to the quadrature error detector (305). One could look at this drift as a drift in the static portion of the phase shift, $\phi_s$, output from VPHS of the AD8302 (410). This drift could be removed by controlling the phase shifter (405) as optionally shown. The quadrature error detector output $Q_e(t)$, is monitored by the sub-Nyquist digital signal processor (325) which could calculate the mean value of measured samples, and this mean value could be set to zero by feedback control (not shown) of the phase shifter (405). Alternatively, the sub-Nyquist processor could simply subtract the mean value of the sampled $Q_e(t)$ values from each $Q_e(t)$ value sampled. This alternate will maintain predistortion as long as the phase measurement range of the AD8302 component is not exceeded. In either case, phase shifter (405) control, or sub-Nyquist processor adjustment, the phase of the signal output (FIG. 1) will drift with component phase drift.

Generally, such drift is small and does not impact modulation accuracy or spectrum emissions or could be removed by adjusting the phase after the signal input (FIG. 1) but prior to the reference coupler (125).

Figure 6:
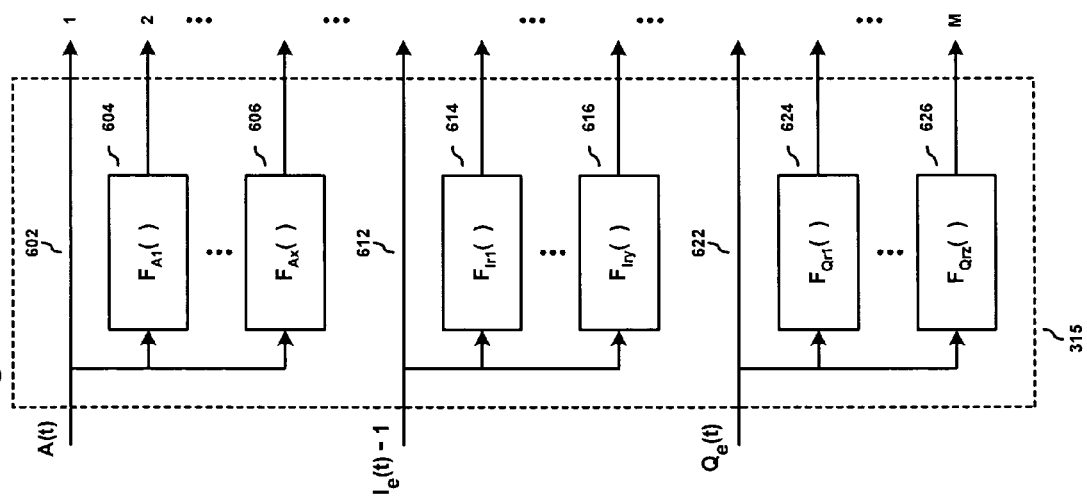
FIG. 6 shows a block diagram of the analog signal processor of FIG. 3.
Figure 7:
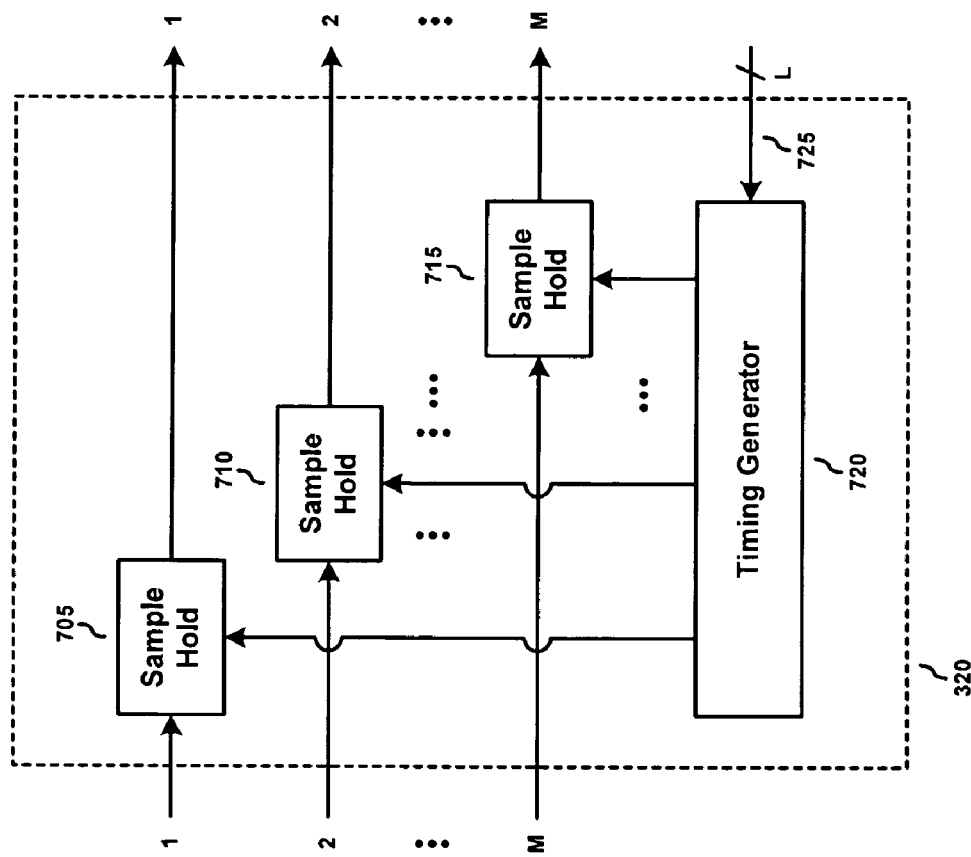
FIG. 7 shows a block diagram of the sampling correlator of FIG. 3.
Figure 8:
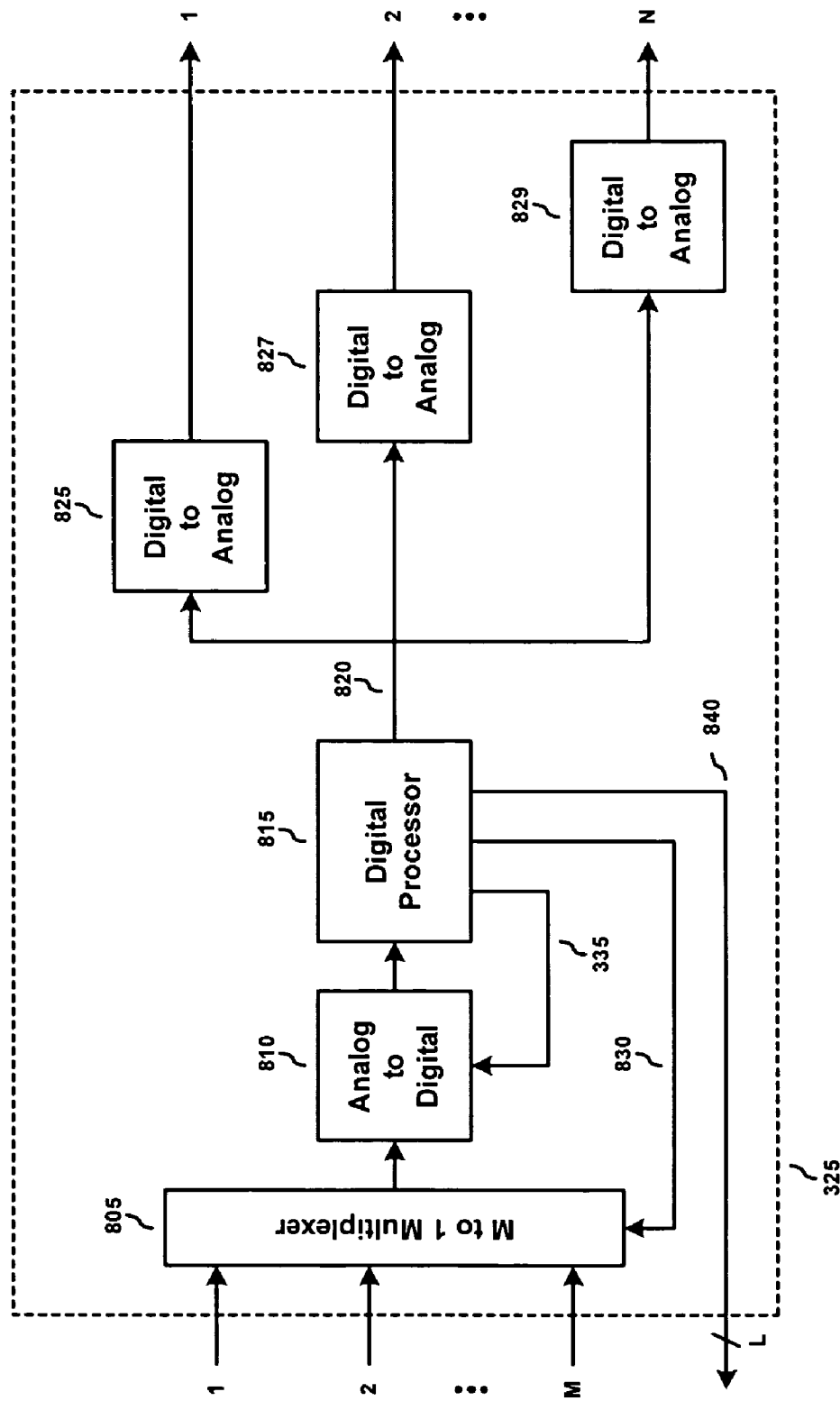
FIG. 8 shows a block diagram of the sub Nyquist digital signal processor of FIG. 3.

The in-phase, $I_e(t)-1$, and quadrature phase, $Q_e(t)$, signals, along with the input amplitude, A(t), signal are provided to an analog signal processor (315). The analog signal processor, shown in greater detail in FIG. 6, may perform time dependent functions such as integrations, derivatives, and filtering on each of the three input signals (($I_e(t)-1$), $Q_e(t)$, and A(t)) as needed during subsequent sub-Nyquist digital signal processing (325). These functions are performed with analog circuits prior to signal sampling so that the sub-Nyquist digital signal processor (325) can operate at a sub-Nyquist rate. The outputs of the analog signal processor (315) are provided to a sampling correlator (320). The sampling correlator (320), show in greater detail in FIG. 7, includes sample-and-hold circuits (705, 710, ..., 715) for each M outputs of the analog signal processor (315). The sampling correlator (320) also includes a timing generator (720) that adjusts the sampling instant of each sample-and-hold circuit. Sample timing is adjusted to insure that each of the M signals from the analog signal processor (315) are properly time correlated so that effective predistortion polynomial parameters can be created in the sub-Nyquist digital signal processor (325). For example, the amplitude signal (A(t)) represents the amplitude of the input signal of FIG. 1. The error signals $I_e(t)$ and $Q_e(t)$ represent the quadrature amplification errors of the combined quadrature modulator (130) and amplifier (140) caused by amplitude changes in the input signal. The timing generator (720) time aligns the cause, A(t), with the effect, $I_e(t)-1$ and $Q_e(t)$, through timing generator (720) time-adjusted sampling. FIG. 3, FIG. 7, and FIG. 8 show that the timing generator (720) receives L lines of control from the sub-Nyquist signal processor (325). These lines of control include the sample clock and controls for adjusting the sample timing of each sample and hold circuit. Such control can be achieved by several circuit methods known to those skilled in the art. Depending on the input signal bandwidth, the required accuracy of this timing adjustment may not be critical. When timing accuracy requirements are slight, fixed or manually adjusted circuits can set timing. In these low timing accuracy systems, only the sampling clock is sent from the sub-Nyquist digital signal processor (325).

The sub-Nyquist digital signal processor (325), shown in greater detail in FIG. 8, receives as inputs M lines from the sampling correlator (320). Since the sampling correlator is holding these signals via the sample-and hold circuits (705, 710, ..., 715), each signal can be sequentially multiplexed (805) into one analog-to-digital converter (810). Multiplexing and conversion commands (830 & 835 respectively) come from the digital processor (815). The digital processor then uses the data received to calculate polynomial parameters. The polynomial parameters are provided to a set of digital-to-analog converters via the data and control bus (820). The analog-to-digital circuit outputs (825, 827, ..., 829) connect the polynomial parameters to the analog function generator (110) completing the predistortion feedback circuit. Alternatively polynomial parameters could be sequentially provided to a single digital-to-analog converter and multiplexed to sample-and-hold circuits. This alternative is generally not preferred due to the low cost of digital-to-analog conversion circuits.

The sub-Nyquist processor calculates polynomial parameters based on sampled values of I
$e(t)-1$, $Q_e(t)$, A(t), and functions thereof calculated in the analog signal processor (315). Since sampling takes place at sub-Nyquist rates the sampled functions are no longer indexed to time. The sub-Nyquist processor therefore indexes all sampled data inputs to bins of signal amplitude $A_B$. For example $Q_e(t)$ and A(t) are time correlated by the sampling correlator (320) producing a data pair, $[Q_e, A]$. Since the samples in this pair are time correlated, the sub-Nyquist processor can determine which bin most closely approximates A and assign the amplitude bin to the sample $Q_e$ producing $Q_e(A_B)$. This is done for each sampled input producing $I_e(A_B)-1$, $Q_e(A_B)$, and functions thereof indexed to $A_B$. With each data input path now indexed to amplitude bins, some data is rejected or adjusted based on analysis of the indexed data from each input path. The teachings of U.S. Provisional Patent Application Ser. No. 60/670,907 filed Apr. 13, 2005, and Utility patent application Ser. No. 11/401,530 filed Apr. 11, 2006, may be employed for such processing, the disclosures of which are incorporated herein by reference in their entirety. For example, data may be rejected based on low amplitude. Data may also be rejected or adjusted based on analysis of the amplitude indexed data sampled from the derivatives, integrations, and filtered signal paths of $I_e(t)-1$, $Q_e(t)$, and A(t) from the analog signal processor (315). After accumulating a sufficient number of acceptable data samples of $I_e(A_B)-1$ and $Q_e(A_B)$, about 10,000, data is again processed. For example, data may be weighted based on the number of samples collected in a particular amplitude index. Next, statistics are calculated. For each data type, $I_e(A_B)-1$ and $Q_e(A_B)$, the mean value and standard deviation is calculated. These mean and standard deviation statistics are calculated for all samples taken regardless of their associated amplitude indexing. These statistical values determine the present state of distortion between reference coupler (125) and output coupler (145). The polynomial parameters are adjusted to minimize a metric function of the processed data. For example, the teachings of U.S. Provisional Patent Application Ser. No. 60/664,098 filed Mar. 22, 2005, and Utility patent application Ser. No. 11/377,023 filed Mar. 16, 2006, may be employed, the disclosures of which are incorporated herein by reference in their entirety. The cycle of data collection, processing, and adjustment continually iterates. This process of polynomial parameter adjustment produces a feedback process that converges on an optimal predistortion solution.

Figure 9:
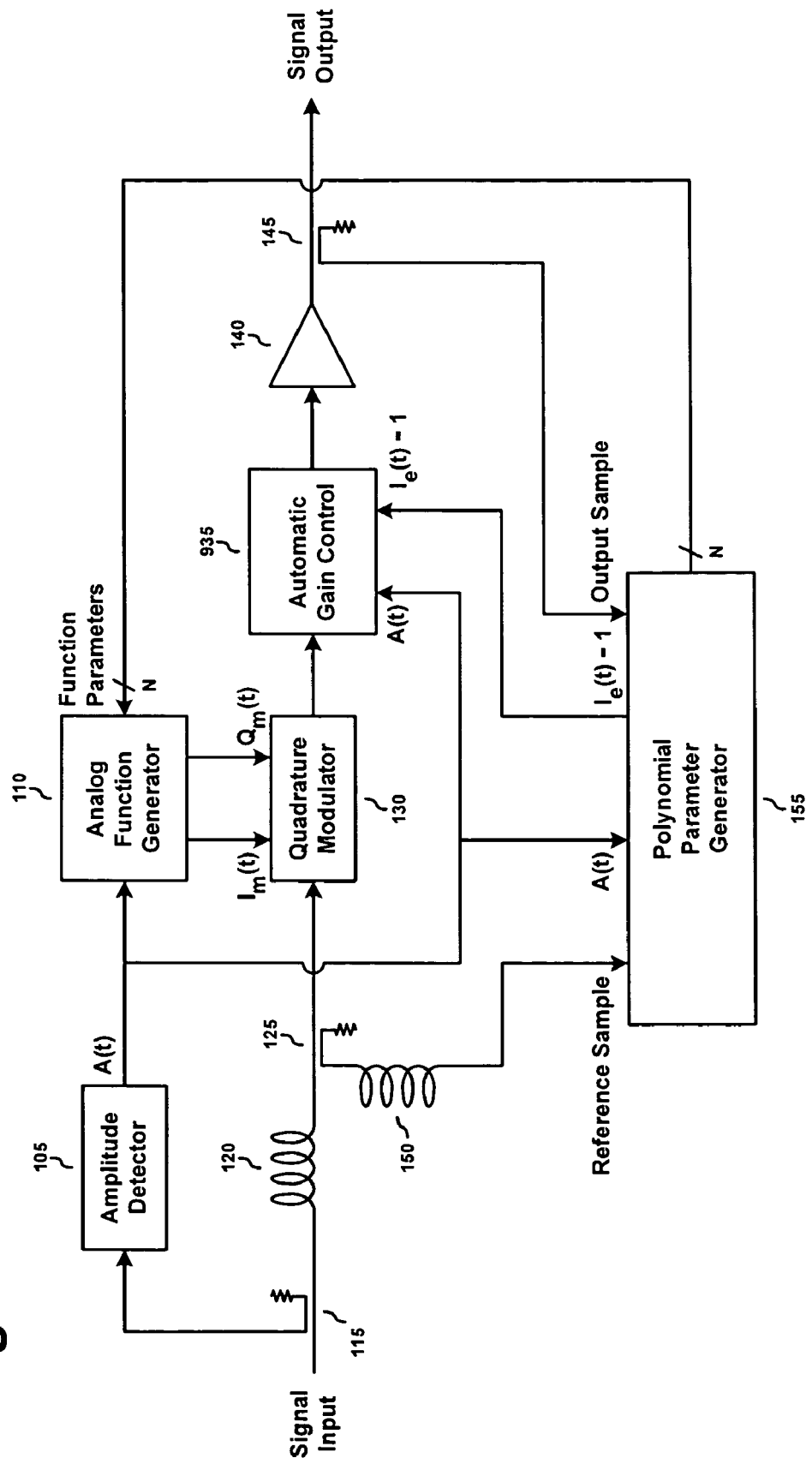
FIG. 9 shows a block diagram of a second embodiment of the present invention employing an automatic gain control circuit.
Figure 10:
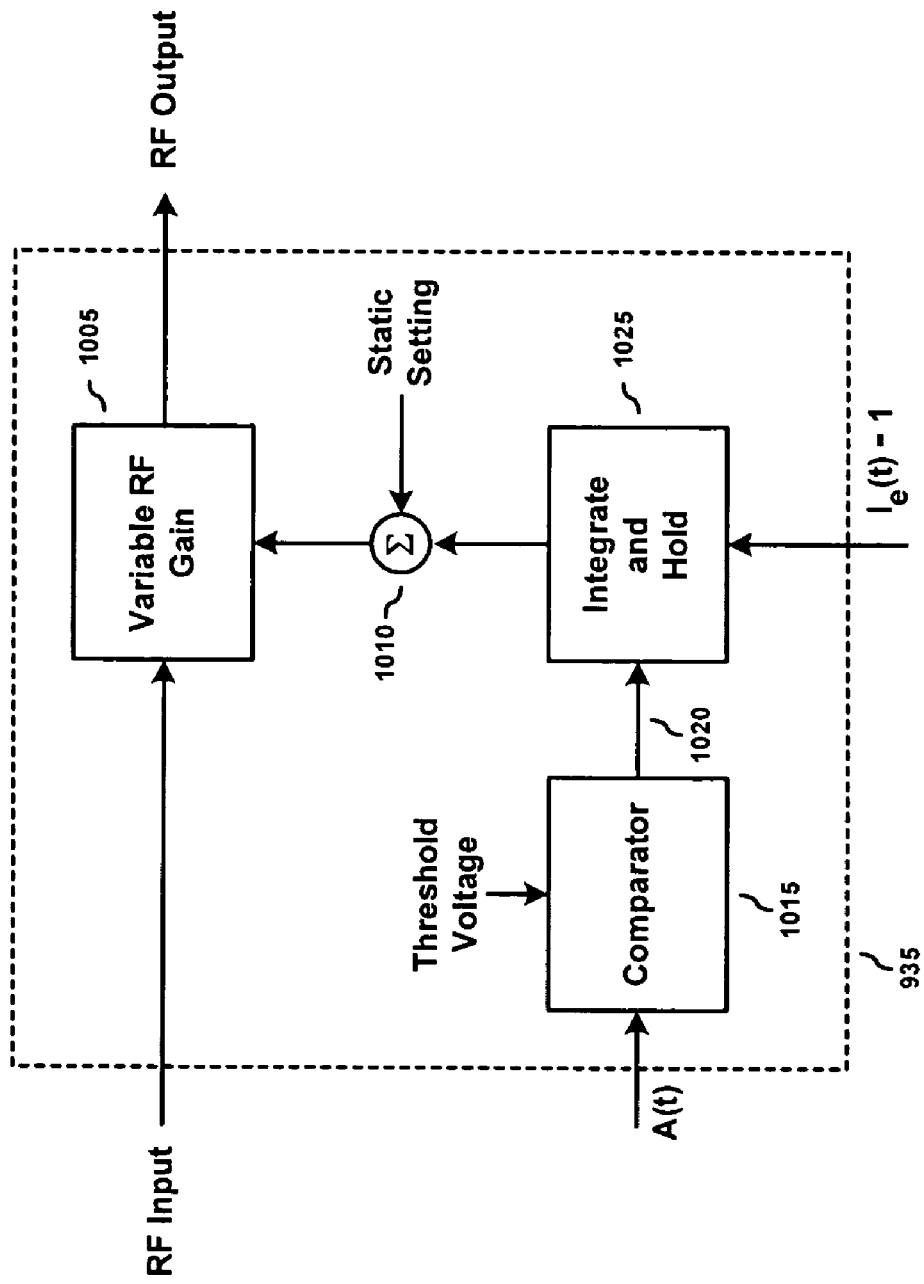
FIG. 10 shows a block diagram of the automatic gain control circuit of FIG. 9.

FIG. 9 shows an alternate embodiment of the present invention. Block diagram elements identical to those found in FIG. 1 have identical reference numbers. The only addition to this alternate embodiment is the inclusion of an automatic gain control block (935). The automatic gain control block (935) is connected between the quadrature modulator (130) and the amplifier (140). Gain control is accomplished through monitoring the input amplitude detector (105) output, A(t), and the optional polynomial parameter generator (310) output, $I_e(t)-1$. FIG. 10 shows a detailed block diagram of the automatic gain control (935). The automatic gain control circuit (935) includes a variable RF gain (1005) that controls the RF gain from the RF input to the RF output. Gain is controlled with both static and dynamic means. Static gain is added (1010) to dynamic gain derived from the input amplitude, A(t), and in-phase errors from the polynomial parameter generator (155), $I_e(t)-1$. The static gain control sets the nominal gain of the variable RF gain (1005) to a nominal value such that the mean value of $I_e(t)-1$ approaches zero through feedback from the polynomial parameter generator (155). In-phase errors, I ,(t)−1, are applied to an integrate-and-hold circuit (1025). The integration time interval (or filter time constant) is chosen to be sufficiently long to remove distortion gain errors caused by RF signal amplitude fluctuations at the input signal information modulation rate, but not distortion gain errors caused by RF signal amplitude fluctuations at the (slower) signal power control rate. Signal power control can induce rapid power amplifier device heating. Such heating can cause rapid changes in amplifier gain. The primary purpose of the automatic gain control circuit is to remove power control induced gain changes. Removing power control induced gain changes improves predistortion caused by the thermal dynamics of the amplifier. These thermal dynamics are often referred to as thermal memory. The secondary purpose of the automatic gain control block (935) is to remove slow gain drift based on supply voltage changes, circuit aging, etc. The automatic gain control circuit optionally (935) uses the hold portion of the integrate-and-hold circuit to hold gain when the input signal drops below the detectable range of the quadrature error detector (305) found in the polynomial parameter generator. This optional hold operation is triggered by an optional comparator (1015) circuit that compares the input amplitude, A(t), to a fixed threshold voltage.

Although specific embodiments of the invention have been described above, it will be appreciated to those skilled in the art that a variety of specific implementations and variations are possible while remaining within the scope of the present invention.

What is claimed is:

1. A predistortion linearized amplifier, comprising:
   an input receiving an analog RF input signal;
   an analog predistortion module including an analog function generator providing analog predistortion signals based on predistortion parameters and an analog predistorter receiving the RF input signal and predistorting the RF input signal based on the analog predistortion signals;
   an amplifier receiving and amplifying the predistorted RF input signal and providing an RF output signal;
   an adaptation module coupled to the input and the amplifier output for providing updated predistortion parameters to the analog function generator, the adaptation module including subNyquist sampling means for providing time correlated sub-Nyquist rate samples of error signals derived from the input and the output RF signals and sub-Nyquist processing means for calculating updated predistortion parameters from said sub-Nyquist samples and providing the parameters to the analog function generator;
   an amplitude signal generator receiving the RF input signal and providing an amplitude signal related to the input signal magnitude to said analog predistortion module and said adaptation module;
   wherein said analog predistorter is a quadrature modulator;
   wherein said adaptation module further comprises an error detector receiving analog samples of the RF input signal and RF output signal and providing in phase and quadrature analog error signals; and
   wherein said adaptation module further comprises analog signal processing means for performing dynamic signal processing on said in phase and quadrature analog error signals and said amplitude signal and outputting M analog signals to said sub-Nyquist sampling means, where M is an integer.

2. A predistortion linearized amplifier as set out in claim 1, wherein said dynamic signal processing performed by said analog signal processing means comprises one or more of integration, differentiation and filtering.

3. A predistortion linearized amplifier as set out in claim 1, wherein said sub-Nyquist sampling means comprises a plurality of sample-and-hold circuits and a timing generator providing sampling timing control signals to said plurality of sample-and-hold circuits.

4. A predistortion linearized amplifier as set out in claim 3, wherein said plurality of sample-and-hold circuits comprise M circuits which receive and sample respective ones of said M signals from said analog signal processing means.

5. A predistortion linearized amplifier system, comprising:
   an input receiving an analog RF input signal;
   an analog predistorter receiving and predistorting said input signal;
   an analog polynomial function generator coupled to the analog predistorter and providing analog polynomial functions to control said predistortion;
   an amplifier coupled to the output of the analog predistorter and amplifying the predistorted input signal to provide an RF output;
   a polynomial parameter generator coupled to receive analog samples of the RF input and RF output signals and provide updated polynomial parameters to said polynomial function generator, comprising an error detector operating on said analog input and output samples to provide error signals and a sub-Nyquist digital processor operating on discrete sub-Nyquist time correlated samples of the error signals to derive said updated polynomial parameters; and
   an input signal magnitude detector outputting an amplitude signal and wherein said sub-Nyquist digital processor correlates discrete sampled error signals with discrete sampled amplitude signals, accumulates them and derives said polynomial predistortion parameters therefrom.

6. A predistortion linearized amplifier system as set out in claim 5, wherein some of said accumulated error and amplitude data pairs are selectively rejected.

7. A predistortion linearized amplifier system as set out in claim 6, wherein error and amplitude pairs with low amplitudes are rejected.

8. A predistortion linearized amplifier system as set out in claim 5, wherein said polynomial predistortion parameters are zero crossing coefficients.

9. A predistortion linearized amplifier system as set out in claim 5, wherein said analog predistorter is an analog quadrature modulator.

10. A method for adaptive analog predistortion of an amplifier system having an RF input receiving an RF input signal, an RF amplifier, and an RF output providing an RF output signal, comprising:
   detecting an amplitude signal related to the magnitude of the RF input signal;
   providing analog predistortion functions based on the amplitude signal and polynomial predistortion parameters;

predistorting the RF input signal employing said analog predistortion functions;

detecting analog samples of the RF input and the RF output signals; and adaptively updating said polynomial predistortion parameters employing analog processing of said amplitude signal and said analog input and output samples to provide plural analog processed signals including error signals, followed by digital processing of sub-Nyquist time correlated discrete samples of the plural analog processed signals;

wherein said digital processing correlates discrete sampled errors with discrete sampled amplitudes, accumulates them and derives updated polynomial predistortion parameters therefrom.

11. A method for adaptive analog predistortion of an amplifier system as set in claim 10, further comprising selectively rejecting some of said correlated error and amplitude data pairs.

12. A method for adaptive analog predistortion of an amplifier system as set in claim 11, wherein error and amplitude pairs with low amplitudes are rejected.

13. A method for adaptive analog predistortion of an amplifier system as set in claim 10, wherein said polynomial parameters are zero crossing coefficients.

14. A method for analog predistortion of an amplifier system as set in claim 10, wherein said analog predistortion functions comprise in phase and quadrature predistortion functions.

* * * * *